US012685134B2

(12) United States Patent (10) Patent No.: US 12,685,134 B2
Lanzillo et al. (45) Date of Patent: Jul. 14, 2026

(54) LOCAL FRONTSIDE POWER RAIL WITH GLOBAL BACKSIDE POWER DELIVERY

(71) Applicant: International Business Machines Corporation, Armonk, NY (US)

(72) Inventors: Nicholas Anthony Lanzillo, Wynantskill, NY (US); Albert M. Chu, Nashua, NH (US); Brent A. Anderson, Jericho, VT (US); Lawrence A. Clevenger, Saratoga Springs, NY (US); Ruilong Xie, Niskayuna, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 17/935,582

(22) Filed: Sep. 27, 2022

(65) Prior Publication Data

US 2024/0105608 A1 Mar. 28, 2024

(51) Int. Cl.
*H10W 20/41* (2026.01)
*H10D 84/01* (2026.01)
*H10D 84/03* (2025.01)
*H10W 20/20* (2026.01)
*H10W 20/42* (2026.01)

(52) U.S. Cl.
CPC ...... *H10W 20/427* (2026.01); *H10D 84/0149* (2025.01); *H10D 84/038* (2025.01); *H10W 20/20* (2026.01); *H10W 20/42* (2026.01)

(58) Field of Classification Search
CPC .............. H01L 23/5286; H01L 23/481; H01L 23/5226; H01L 23/5283; H10D 84/0149; H10D 84/038
See application file for complete search history.

(56) References Cited

U.S. PATENT DOCUMENTS

| | | | |
|---|---|---|---|
| 10,636,739 | B2 | 4/2020 | Beyne et al. |
| 2004/0060030 | A1 | 3/2004 | Fujimoto |
| 2009/0051040 | A1 | 2/2009 | Chuang |
| 2018/0145030 | A1 | 5/2018 | Beyne et al. |
| 2020/0266169 | A1 | 8/2020 | Kang et al. |

(Continued)

FOREIGN PATENT DOCUMENTS

EP 3002784 A1 9/2015

OTHER PUBLICATIONS

Chen et al., "Design and Optimization of SRAM Macro and Logic Using Backside Interconnects at 2nm node," IEEE International Electron Devices Meeting, Dec. 2021, pp. 498-501.

(Continued)

*Primary Examiner* — Mohammad A Rahman
(74) *Attorney, Agent, or Firm* — CANTOR COLBURN LLP; Kimberly Zillig

(57) ABSTRACT

A method for forming a semiconductor device includes forming a front side of the semiconductor device, the front side comprising a metal wire M2, and a plurality of power rails coupled to the M2. Further, the method includes forming a through silicon via (TSV) from a back side of the semiconductor device to the front side, the TSV connecting a first power rail of the front side with a metal wire M1 on the back side. Further, the method includes forming a power delivery network on the back side, the TSV providing power from the power delivery network to the front side.

21 Claims, 7 Drawing Sheets

(56) References Cited

U.S. PATENT DOCUMENTS

| | | | |
|---|---|---|---|
| 2020/0373242 A1 | 11/2020 | Hibolt et al. | |
| 2021/0118805 A1 | 4/2021 | Sio et al. | |
| 2022/0115324 A1* | 4/2022 | Chiu | H01L 23/5286 |
| 2022/0328399 A1* | 10/2022 | Preston | H10W 20/20 |

OTHER PUBLICATIONS

Huang et al., "Selected Nanotechnology Advances in Interconnections, Power, RF and Sensor Integration," A View from ECTC 2022, 8 pages.

Jourdain et al., "Buried Power and Nano-Scale TSV: Technology Boosters for Backside Power Delivery Network and 3D Heterogeneous Integration," IEEE 72nd Electronic Components and Technology Conference, 2022, pp. 1531-1538.

* cited by examiner

LOCAL FRONTSIDE POWER RAIL WITH GLOBAL BACKSIDE POWER DELIVERY

BACKGROUND

The present invention generally relates to fabrication methods and resulting structures for semiconductor devices, and more specifically, to processing methods and resulting structures for providing a local frontside power rail with global backside power delivery.

The development of an integrated circuit (i.e., chip) involves several stages from design through fabrication. Many aspects of the development are performed iteratively to ensure that the chip manufactured meets all design requirements. Defining the chip architecture is one of the earliest phases of integrated circuit development. The power (e.g., power requirement), performance (e.g., timing), and area (i.e., space needed) for the resulting chip, collectively PPA, is one of the primary metrics by which integrated circuits are evaluated. PPA is a consequence of the chip architecture.

Semiconductor fabrication continues to evolve towards improving one or more aspects of PPA. For example, a higher number of active devices (transistors) of ever decreasing device dimensions are placed on a given surface of semiconductor material. Density scaling has put a strain on the design and fabrication of the interconnects between the front end of line of the integrated circuit, consisting of the active devices, and the contact terminals of the integrated circuit. In many chip architectures, all of these interconnects are incorporated in the back end of line (BEOL) structure of the integrated circuit, which includes a stack of metallization layers and vertical via connections built on top of the front end of line (FEOL) structure.

A key component of the BEOL structure is the power delivery network (PDN). The PDN of an integrated circuit is defined by the conductors and vias connected to the power supply (VDD) and ground (VSS) terminals of the chip. The PDN is responsible for delivering power to the individual devices in the front end. The integration of the PDN in the BEOL has become particularly challenging as device densities continue to scale. Backside power delivery is one known solution to this problem, and involves moving some (or most, or all) layers of the PDN from the front side of the integrated circuit to the back side. In a backside-style architecture, the repositioned layers are not formed on top of the FEOL, but are instead formed on the opposite side of the chip (i.e., on the backside of the semiconductor substrate onto which the active devices have been built).

SUMMARY

According to one or more embodiments of the present invention, a method for forming a semiconductor device includes forming a front side of the semiconductor device, the front side including a metal wire M2, and multiple power rails coupled to the M2. Further, the method includes forming a through silicon via (TSV) from a back side of the semiconductor device to the front side, the TSV connecting a first power rail of the front side with a metal wire M1 on the back side. Further, the method includes forming a power delivery network on the back side, the TSV providing power from the power delivery network to the front side.

In one or more embodiments of the present invention, a first set of power rails from the power rails is electrically connected directly to a device region of the front side.

In one or more embodiments of the present invention, the first power rail from the power rails of the front side is wider than a second power rail from the power rails of the front side. The first power rail can be a power supply (VDD).

In one or more embodiments of the present invention, the first power rail includes a pair of adjacent power rails from the power rails.

In one or more embodiments of the present invention, the power rails include power supply (VDD) and ground (VSS) terminals.

In one or more embodiments of the present invention, the metal wire M2 is discontinuous.

According to one or more embodiments of the present invention, a semiconductor device includes a front side including a metal wire M2 and multiple power rails coupled to the M2. The semiconductor device further includes a back side including a metal wire M1 and a power delivery network. The semiconductor device further includes a through silicon via (TSV) connecting a first power rail from the power rails of the front side with the M1 on the back side, the TSV providing power from the power delivery network to the front side.

According to one or more embodiments of the present invention, an electronic device includes a semiconductor device including a front side including multiple power rails, wherein the power rails include two types of power rails, a first type of power rails that is wider than a second type of power rails.

Embodiments of the present invention address technical challenges with chip architectures for backside power delivery and facilitate improving the architectures by making efficient use of the space (i.e., reducing waste). Additionally, embodiments of the present invention facilitate creating a "tap-cell" for front side-to-back side connection without interrupting circuit row design. Embodiments of the present invention provide design flexibility. Further, embodiments of the present invention facilitate having a wider through-silicon via that provides that the front side-to-back side connection has a lower resistance (compared to a narrower via).

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
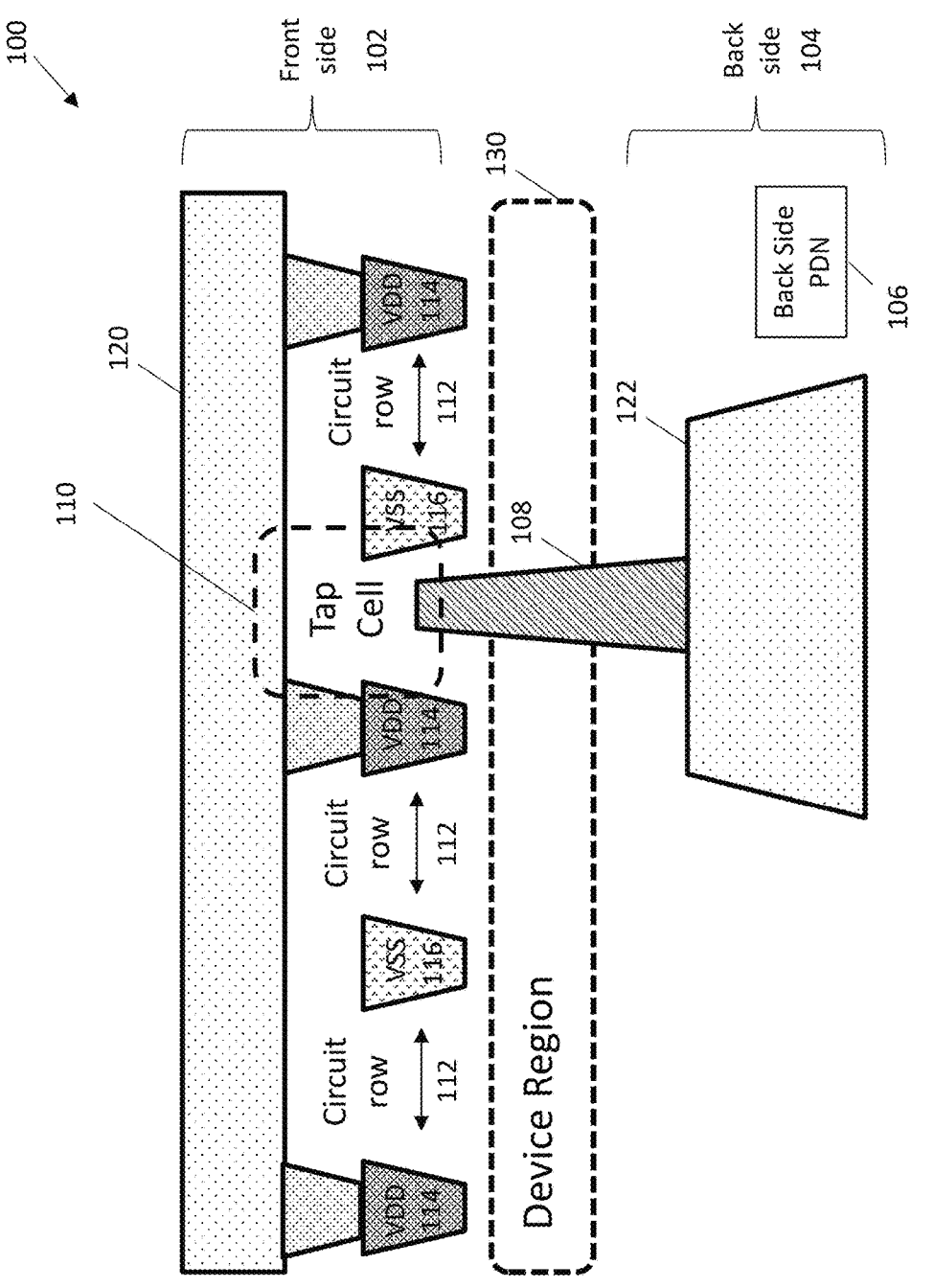
FIG. 1 depicts an example three-dimensional view of a semiconductor device architecture.

The diagrams depicted herein are illustrative. There can be many variations to the diagram, or the operations described therein without departing from the spirit of the invention. For instance, the actions can be performed in a differing order or actions can be added, deleted, or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, a component of the BEOL structure is the power delivery network (PDN). Backside power delivery (also referred to as a backside power delivery network) is a chip architecture that involves repositioning layers of the PDN from the top of the FEOL to the opposite side of the chip. In other words, in a backside-style architecture the PDN layers are placed on the backside of the semiconductor substrate onto which the active devices have been built. Challenges remain, however, in modifying chip architectures for backside power delivery.

Figure 2:
FIG. 2 depicts a two-dimensional view of the semiconductor device architecture.
Figure 2:
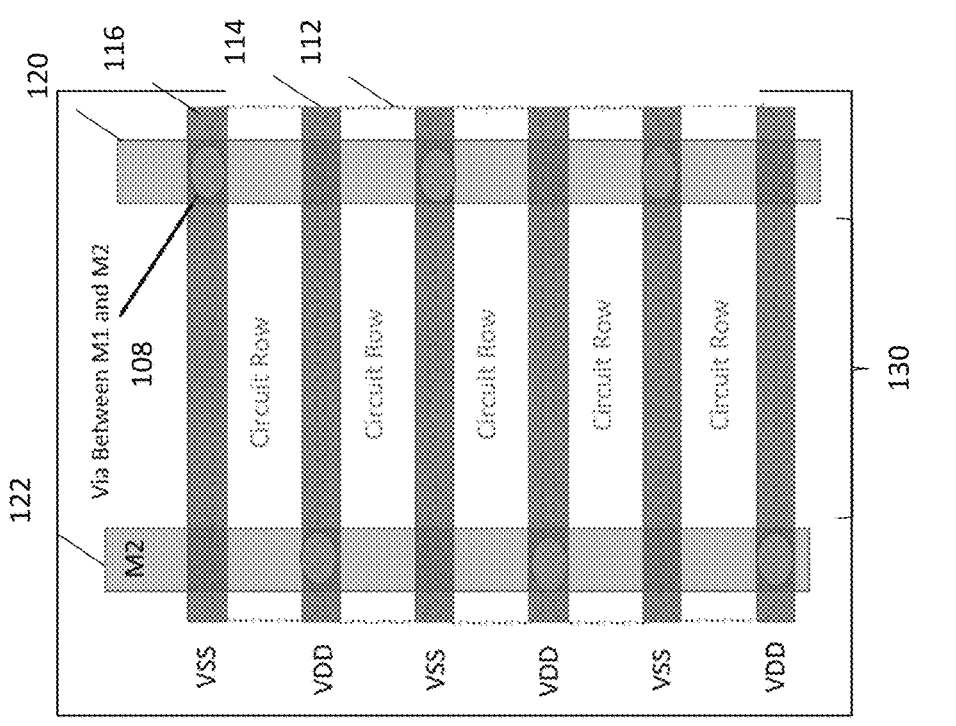

FIG. 1 depicts an example three-dimensional view of a semiconductor device architecture 100 (or structure). In the depicted structure 100, a front side 102 and a back side 104 are shown with a back side PDN 106. FIG. 2 depicts a two-dimensional view of the semiconductor device architecture 100. The front side 102 and the back side 104 enclose a device region 130 between the two of them. The device region 130 includes one or more rows of circuits (circuit rows 112). For the PDN 106 to provide power to the front side a physical connection 108 has to be established between the back side 104 and the front side 102. The physical connection 108 can be a through-silicon via (TSV) or through-chip via, which is a vertical electrical connection (via) that passes completely through a silicon wafer or die. TSVs 108 are high-performance interconnect techniques used as an alternative to wire-bond and flip chips to create 3D packages and 3D integrated circuits connections to M1 120.

Any connection 108 (i.e., via) from the back side 104 to the front side 102 requires a dedicated tap cell 110. The connection 108 facilitates connecting M1 120 wire on the front side 102 with a second wire (M2) 122 on the back side 104. The tap cell 110 interrupts circuit rows 112. The tap cell 110 is where the connection 108 from the back side metal (M1) 120 extends and reaches (touches) the front side metal (M2) 122. As can be seen in the structure 100, the tap cell 110 takes up space that could have been another circuit row 112. A "circuit row" is between a pair of adjacent power rails VDD 114 and VSS 116. Because the circuit rows 112 are interrupted by the tap cell 110, the circuit design has to be modified to account for such interruptions caused by the tap cell 110. In addition, space in the semiconductor device is wasted, i.e., inefficiently used. The space could be instead used by another circuit row 112, or other components that further the semiconductor's function.

In present architecture 100, the tap cell 110 is adjacent to power rails, VDD 114 and VSS 116, and typically between a pair of such power rails; hence, occupying space that could have been used by a circuit row 112 instead. The tap cell 110 is on the front side 102 allowing the physical connection between the M1 120 and M2 122.

Embodiments of the present invention address such technical challenges and facilitate improving the structure by making efficient use of the space (i.e., reducing waste). Embodiments of the present invention accordingly provide improvements to computing technology and are rooted in computing technology, particularly fabrication and architecture of semiconductor devices. Further, embodiments of the present invention provide practical applications by improving the manufacturing and architecture of semiconductor devices.

Figure 3:
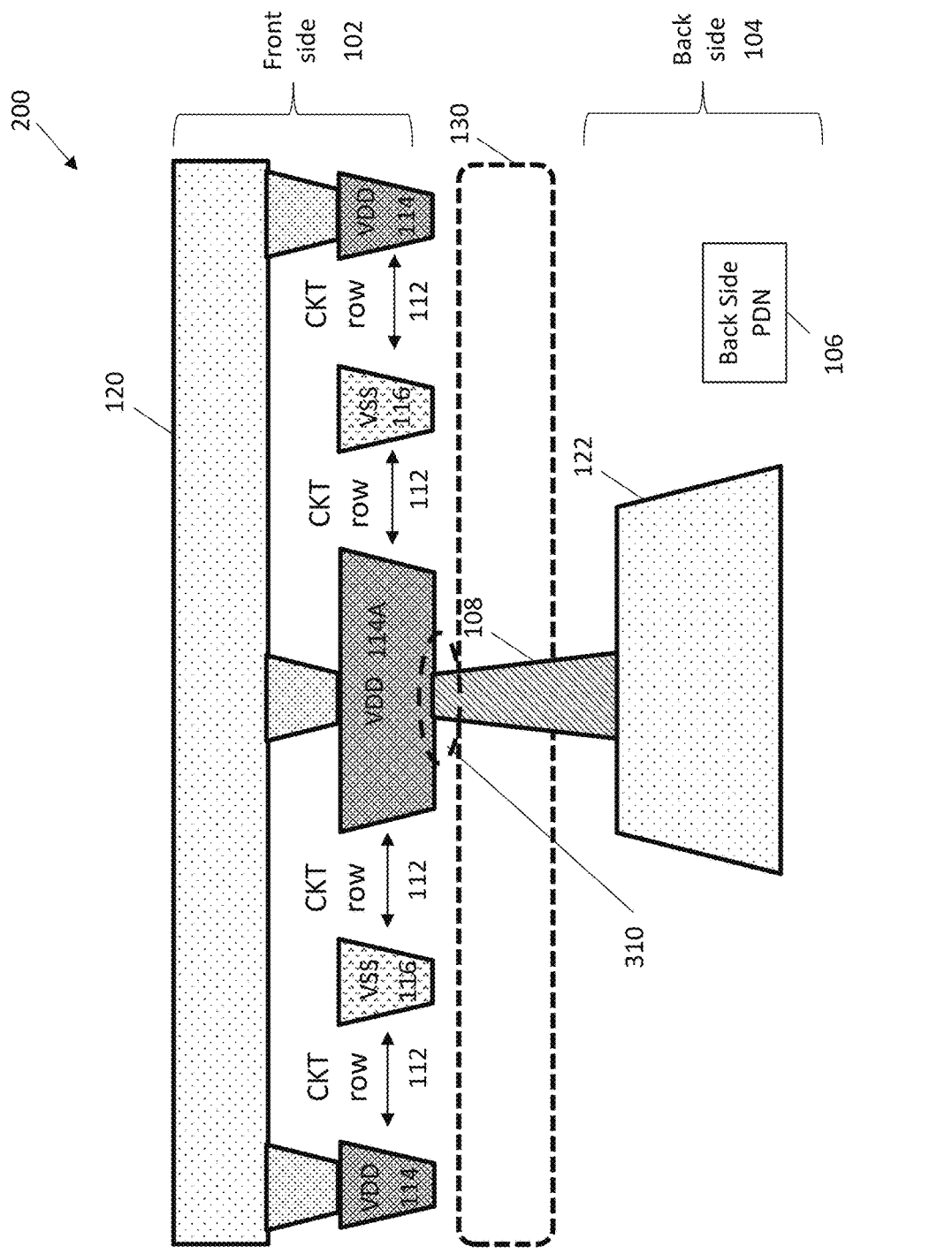
FIG. 3 depicts a three-dimensional view of a semiconductor device architecture according to one or more embodiments of the present invention.
Figure 4:
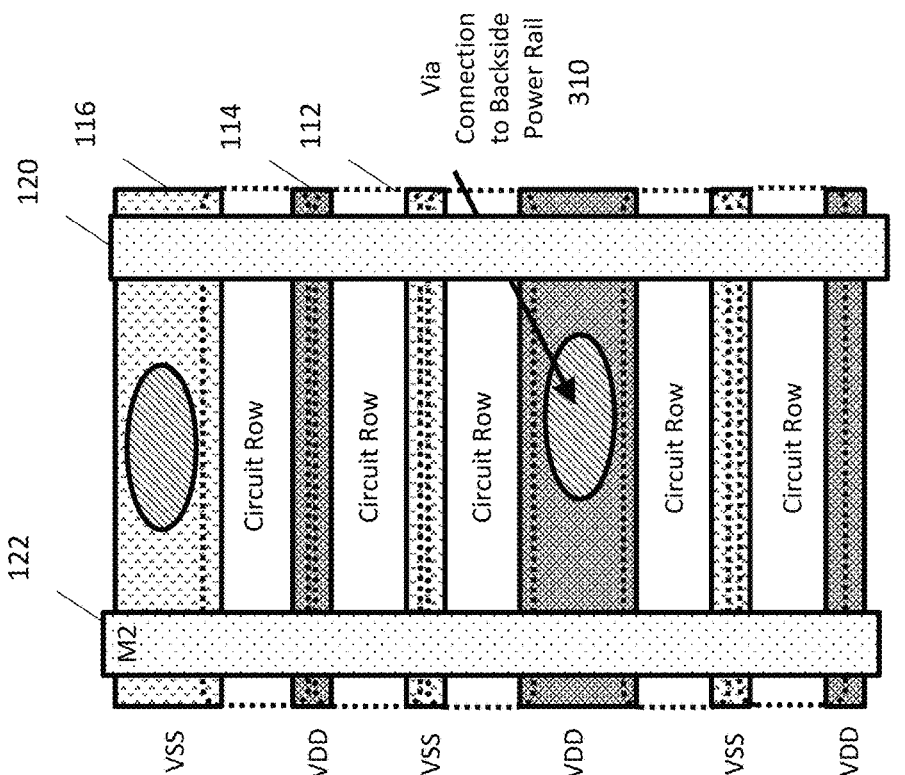
FIG. 4 depicts a two-dimensional view of the semiconductor device architecture according to one or more embodiments of the present invention.

FIG. 3 depicts a three-dimensional view of a semiconductor device architecture 200 according to one or more embodiments of the present invention. FIG. 4 depicts a two-dimensional view of the semiconductor device architecture 200 according to one or more embodiments of the present invention. The architecture 200 also includes the front side 102, back side 104, and device region 130, with the back side 104 including the PDN 106. The device region 130 includes several circuit rows 112 punctuated by power rails, VDD 114 and VSS 116.

In the architecture 200, the power rails (also referred to as interconnect wiring) on the front side 102 are of two types. A first type of rail has a width smaller than a second type of rail. For example, in FIG. 3, an instance of VDD 114A has a larger width than other power rails, VDD 114 and VSS 116. It is understood that any other power rail could have been the wider power rail, and that the particular power rail shown is just one illustration. Further, it should be noted that although VDD 114A is depicted to be the wider power rail, in other embodiments of the present invention, a VSS type power rail can be a wider power rail.

The first (narrower) and second (wider) types of power rails 114/116 and 114A (with different widths) on the same net are connected at the M2 metal 120 on the front side 102 of the semiconductor architecture 200, i.e., chip. It should be noted that the first type of power rails, are relatively narrower than the second type of (wider) power rails. Each wider power rail (114A) is adjacent to narrower power rails (114/116) on either side. In other words, the two wider power rails (114A) are not adjacent to each other, and are separated by at least one narrower power rail (114/116). Consistent circuit rows 112, without any constraints of a tap cell 110, can be placed between the two successive wider power rails (114A). While the drawings herein show three circuit rows 112 interspersed between two successive wider power rails (114A), it should be understood that in other embodiments of the present invention, the number of circuit rows 112 between the wider power rails (114A) can vary.

The wider power rails (114A) are used to establish a physical connection (310) with the TSV 108 from the back side 104. The TSV 108 that extends from the back side 104 physically contacts the wider power rail (114A). In this manner, the tap cell 110 from the architecture 100 is advantageously eliminated. Alternatively, the physical connection 310 that is established between the TSV 108, and the wider power rail (114A) can be considered the tap cell.

In one or more embodiments of the present invention, the first level of backside wiring (122) has the same pitch as the wider power rail (114A) on the front side 102. This can facilitate having a wider TSV 108 that provides a further advantage that the front side-to-back side connection has a lower resistance (compared to a narrower via). In one or more embodiments of the present invention, the TSV 108 is on the order of 100 nm wide. In one or more embodiments of the present invention, the narrower TSV 108 can result in a 50% or more reduction in TSV resistance. As an example, instead of ~100 Ohms in present scenarios, embodiments of the present invention enable TSV resistance of 10-50 Ohms.

In one or more embodiments of the present invention, the wider pitch of the back side M1 122 is made larger than cell height. "Cell height" is the pitch of power rails at the first metal level and defines the height of all logic gates. For example, in some technologies (beyond the 7-nm CMOS node), cell height is on the order of 100-200 nm. Accordingly, the total number of backside metal levels required is reduced by using the wider pitch of the back side M1 122.

Accordingly, embodiments of the present invention facilitate creating a "tap-cell" for front side-to-back side connection without interrupting circuit row design. Embodiments of the present invention provide several design flexibility aspects, such as variable wide VDD/VSS pitch, variable M2 staple placement, etc.

Figure 5:
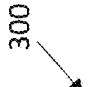
FIG. 5 depicts a two-dimensional view of the semiconductor device architecture according to one or more embodiments of the present invention.
Figure 5:
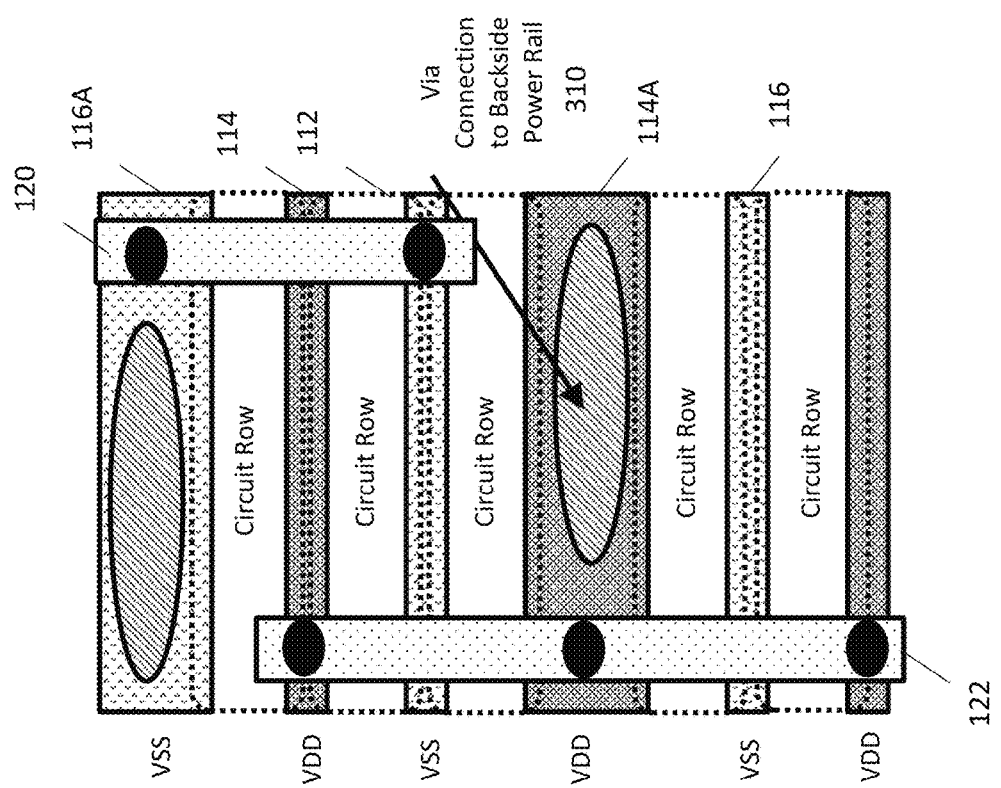

FIG. 5 depicts a two-dimensional view of the semiconductor device architecture 300 according to one or more embodiments of the present invention. The architecture 300 facilitates the technical solutions and advantages provided by the architecture 200 (FIG. 3 and FIG. 4). In architecture 300, the power rails are discontinuous so as to allow the TSV 108 to be wider (beyond a predetermined threshold) compared to the architecture 200. For example, the TSV 108 may have a width comparable to the pitch of the M2 power lines, in the range 100-500 nm. In one or more embodiments of the present invention, the TSV 108 has width of 1 um.

The architecture 300 has the power rails of at least two different widths, with a subset of power rails (114A) wider than the rest of power rails (114/116). The TSVs 108 connect the front side 102 and the back side 104 using the wider power rails 114A.

Figure 6:
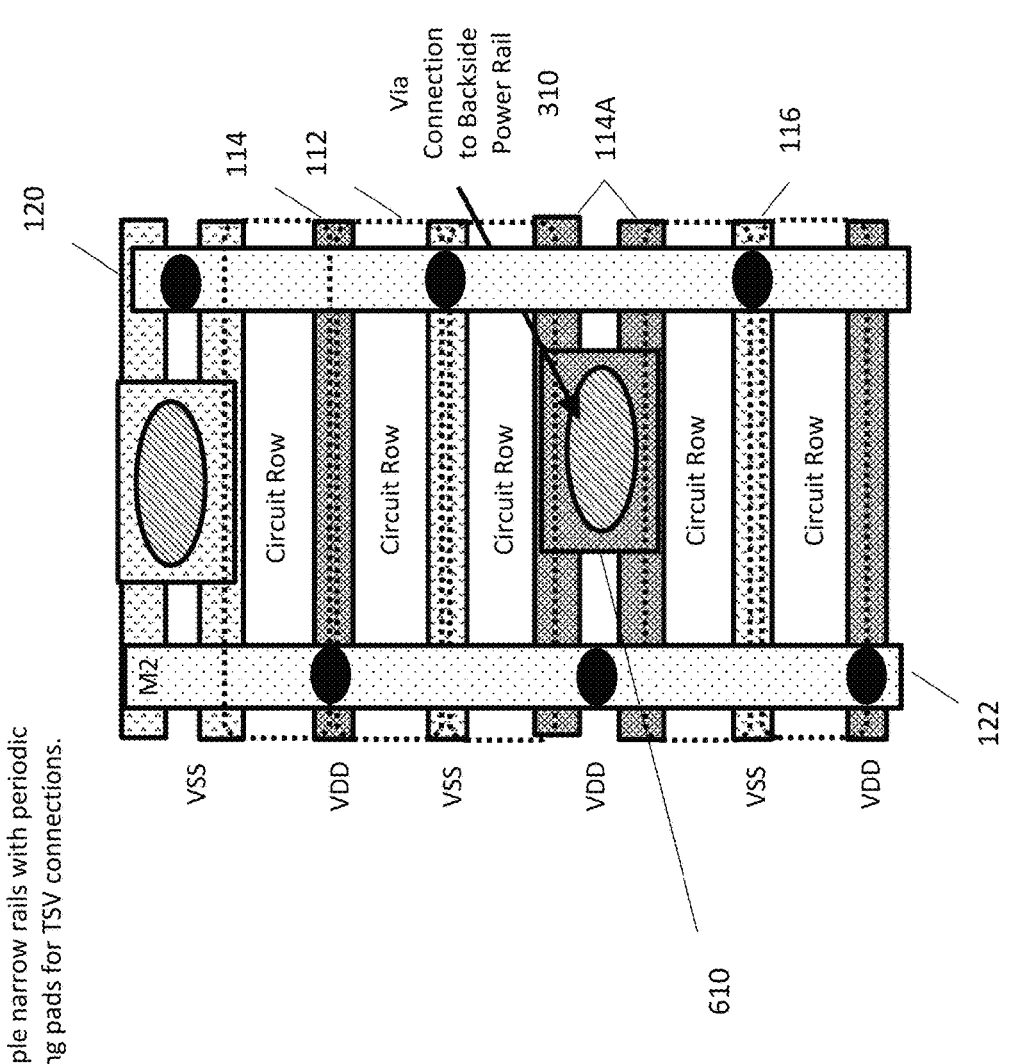
FIG. 6 depicts a two-dimensional view of the semiconductor device architecture according to one or more embodiments of the present invention.

FIG. 6 depicts a two-dimensional view of the semiconductor device architecture 400 according to one or more embodiments of the present invention. The architecture 400 facilitates the technical solutions and advantages provided by the architecture 200 (FIG. 3 and FIG. 4). In architecture 400, the TSV 108 is connects the front side 102 M2 120 and the back side 104 M1 122 using a landing pad 610. Here, the power rails 114, 116 are all of uniform width. Two or more adjacent power rails are used together to form a wider power rail (114A) by forming a landing pad 610 that connects the two or more adjacent power rails. The landing pad 610 is formed of a conductive material and connects the two or more adjacent power rails to each other.

In one or more embodiments of the present invention, the landing pad 610 is wider than the power rails 114, 116. The TSV 108 from the back side M1 120 connects to the landing pad 610, and in turn connects to the power rails that are used together to create the wider power rail 114A. Accordingly, the architecture 400 provides the technical solutions and advantages described herein by increasing the width of the power rails 114, 116 partially, at a particular region represented by the landing pad 610.

Compared to the architecture 200, the architecture 400 facilitates the use of wider power rail (instead of the tap cell 110) in the case that the design of the semiconductor cannot have the (relatively) larger spacing on either side of a wide power rail (114A) due to patterning constraints.

Figure 7:
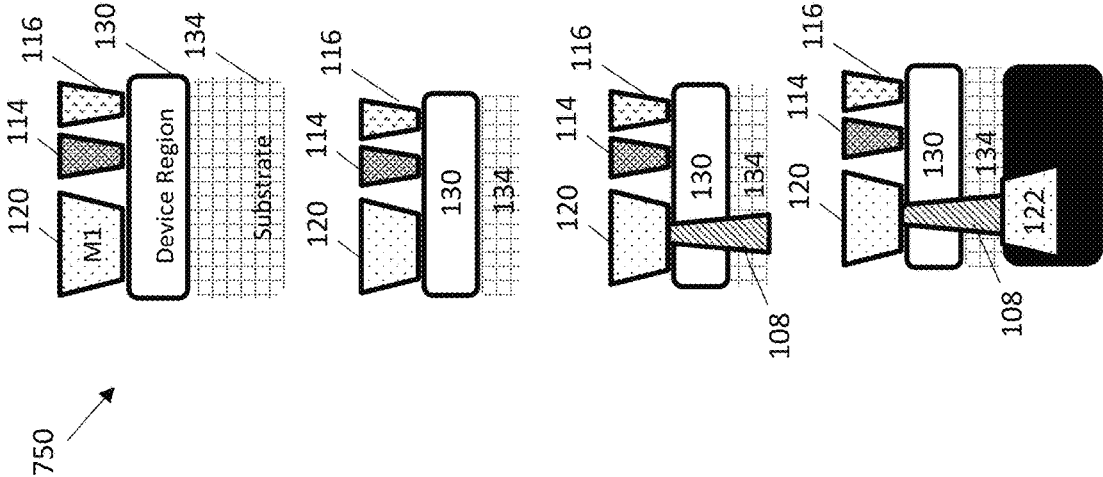
FIG. 7 depicts a flowchart of a method to manufacture a semiconductor device using an architecture according to one or more embodiments of the present invention.
Figure 7:
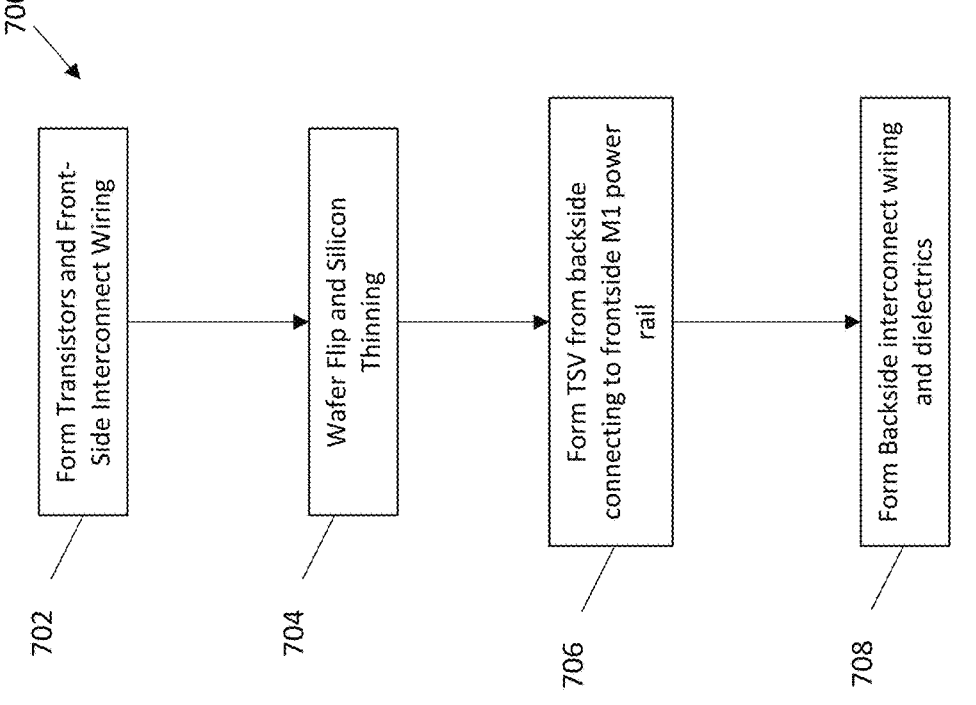

FIG. 7 depicts a flowchart of a method to manufacture a semiconductor device using an architecture according to one or more embodiments of the present invention. The method 700, at block 702, includes forming transistors and front side interconnect wiring. The transistors and the front side interconnect wiring form the device region 130 and the front side 102 of the semiconductor device 750 being manufactured.

The transistors formed can include nanosheet-style transistors, vertical tunneling transistors, planar transistors, fin-FETs, etc. While nanosheet-style transistors are described in the examples herein, it is understood that the technical solutions provided herein are not limited to that particular type and any other type of transistors can be formed in other embodiments of the present invention.

In one or more embodiments of the present invention, gates are formed over channel regions of the one or more nanosheets. As used herein, a "channel region" refers to the portion of a nanosheet of the one or more nanosheets over which the gate is formed, and through which current passes from source to drain in the final device 750. The semiconductor wafer can further include inner spacers, gate spacers, a shallow trench isolation (STI) region, source/drain (S/D) regions, interlayer dielectrics, sacrificial materials, contacts (e.g., S/D contacts), vias (S/D contact vias and gate contact vias), and a gate cut, configured, and arranged. In some embodiments of the present invention, the semiconductor wafer includes a substrate 134 having a buried oxide layer (i.e., an etch stop layer), although other substrate configurations are within the contemplated scope of this disclosure. In some embodiments, the substrate 134 includes a silicon-on-insulator (SOI) structure having a bottommost substrate layer (not separately shown). The bottommost substrate layer can be removed post-wafer flip to expose the buried oxide layer.

In some embodiments, the buried oxide layer is removed and the substrate 134 is recessed to expose a top surface of the STI region, the sacrificial materials, and the S/D contacts 126. The buried oxide layer can be removed and the substrate 134 can be recessed using any suitable technique, such as, for example, using a wet etch, a dry etch, or a combination of sequential wet and/or dry etches. In some embodiments, the substrate 134 can be recessed below the top surface of the STI region, the sacrificial materials, and/or the S/D contacts.

In some embodiments, a first fraction of the interconnect lines (i.e., power rails VDD/VSS wires 114, 116) is connected directly to the device region 130 on the chip, while the second fraction of interconnect lines does not make connections to the device region of every cell (e.g., signal/clock wires). In some embodiments, the second fraction of interconnect lines is less than the first fraction.

In some embodiments of the invention, a backside dielectric is formed on the semiconductor wafer. In some embodiments, the backside dielectric is deposited or otherwise formed on the recessed surface of the substrate 134.

In some embodiments of the present invention, the backside dielectric is a high-k dielectric. As used herein, a "high-k" dielectric refers to a material having a dielectric constant greater than 3.7 (i.e., a higher dielectric constant than the reference silicon dioxide, which has a dielectric constant of about 3.7 to 3.9). Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

In some embodiments of the present invention, portions of the backside dielectric 302 are removed to define a trench (e.g., a clock signal wire opening) exposing the top surface of the sacrificial materials 124. The portions of the backside dielectric can be removed using any suitable technique, such as, for example, using a wet etch, a dry etch, or a combination of sequential wet and/or dry etches.

In some embodiments of the present invention, a dielectric spacer is deposited or otherwise formed over the backside dielectric on sidewalls of the trench. In some embodiments of the present invention, the dielectric spacer is a low-k dielectric. As used herein, a "low-k" dielectric refers to a material having a dielectric constant lower than 3.7 (i.e., a lower dielectric constant than the reference silicon dioxide, which has a dielectric constant of about 3.7 to 3.9). Examples of low-k materials include, but are not limited to, porous silicon dioxide, doped silicon dioxide (using, e.g., carbon, fluorine, etc.), silsesquioxanes, organosilicates, air (e.g., air gaps), etc. Further, in some embodiments of the present invention, the sacrificial materials can be removed to extend the trench. In this manner, portions of the gate and sidewalls of the STI region can be exposed. The sacrificial materials can be removed using any suitable technique, such as, for example, using a wet etch, a dry etch, or a combination of sequential wet and/or dry etches. In some embodiments, the sacrificial materials 124 can be removed selective to the STI region.

At block 704, wafer flip and silicon thinning are performed. In some embodiments of the present invention, the carrier wafer can be formed prior to flipping the semiconductor wafer.

At block 706, the TSV 108 is formed from the backside connecting to frontside M1 120 power rail. The TSVs 108 can be formed by etching a vertical via through the substrate 134 and filling the via with a conductive material, such as copper. The TSVs 108 may be used to provide an electrical contact on a backside of the semiconductor substrate to semiconductor circuitry on an opposing side of the substrate or another die. In this manner, dies may be stacked while maintaining a smaller package size.

In one or more embodiments of the present invention, a barrier layer is deposited along sidewalls of the opening to create a diffusion barrier to prevent the conductive material, such as copper, from diffusing into the substrate 134 and/or one or more dielectric layers. The barrier layer may comprise a dielectric and/or conductive barrier layer, such as a nitrogen-containing layer, a carbon-containing layer, a hydrogen-containing layer, a silicon-containing layer, a metal or metal-containing layer doped with an impurity (e.g., boron), such as tantalum, tantalum nitride, titanium, titanium nitride, titanium zirconium, titanium zirconium nitride, tungsten, tungsten nitride, cobalt boron, cobalt tungsten, an alloy, combinations thereof, or the like. The barrier layer may be formed, for example, by physical vapor deposition (PVD), atomic layer deposition (ALD), spin-on deposition, or other suitable methods.

At block 708, backside interconnect wiring and dielectrics are formed.

In some embodiments of the present invention, the trenches are filled with conductive material to define a signal wire, i.e., M1 122. This process can be referred to as a backside M1 metallization. The signal wire can be formed from any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials.

After backside M1 122 metallization is complete, the semiconductor wafer can be finalized using known processes (e.g., BEOL, far back end of line (FBEOL), packaging, etc., processes used to define a final device, including the incorporation of additional $M_x$ metallization layers).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled," and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a front side comprising a metal wire M2, and a plurality of power rails coupled to the M2, the plurality of power rails comprising the first power rail and a second power rail, the first power rail being wider than the second power rail;
   a back side comprising a metal wire M1 and a power delivery network; and
   a through silicon via (TSV) connecting a first power rail from the plurality of power rails of the front side with the M1 on the back side, the TSV physically contacting the first power rail, the TSV providing power from the power delivery network to the front side.

2. The semiconductor device of claim 1, wherein a first set of power rails from the plurality of power rails is electrically connected directly to a device region of the front side.

3. The semiconductor device of claim 1, wherein, the first power rail and the second power rail are connected at the metal wire M2.

4. The semiconductor device of claim 3, wherein the first power rail is a power supply (VDD).

5. The semiconductor device of claim 3, wherein the first power rail comprises a pair of adjacent power rails from the plurality of power rails.

6. The semiconductor device of claim 1, wherein the plurality of power rails comprises power supply (VDD) and ground (VSS) terminals.

7. The semiconductor device of claim 1, wherein the metal wire M2 is discontinuous.

8. The semiconductor device of claim 3, wherein the first power rail is adjacent to narrower power rails on either side.

9. The semiconductor device of claim 8, wherein two wider power rails are not adjacent to each other and are separated by at least one narrower power rail.

10. The semiconductor device of claim 9, wherein circuit rows are placed between two successive wider power rails without interruption by a tap cell.

11. The semiconductor device of claim 3, wherein the first power rail is used to establish a physical connection with the TSV, and wherein the TSV physically contacts the first power rail.

12. The semiconductor device of claim 11, wherein the physical connection between the TSV and the first power rail constitutes a tap cell.

13. The semiconductor device of claim 11, wherein a first level of backside wiring has the same pitch as the first power rail.

14. The semiconductor device of claim 13, wherein the TSV is on the order of 100 nm wide.

15. The semiconductor device of claim 1, wherein two or more adjacent power rails are connected to each other by a landing pad formed of a conductive material, the landing pad being wider than the power rails, and wherein the TSV connects to the landing pad.

16. An electronic device comprising:

a semiconductor device comprising a front side comprising a plurality of power rails, wherein the power rails comprise two types of power rails, a first type of power rails that is wider than a second type of power rails and two power rails of the first type are not adjacent to each other and are separated by at least one power rail of the second type.

17. The electronic device of claim 16, wherein the front side further comprises a metal wire M2, wherein the power rails are coupled with the metal wire M2.

18. The electronic device of claim 16, wherein the semiconductor device further comprises a back side comprising a metal wire M1 and a power delivery network.

19. The electronic device of claim 18, wherein the semiconductor device further comprises a through silicon via (TSV) connecting a first type of power rail of the front side with to the metal wire M1 on the back side, the TSV physically contacting the first type of power rail.

20. The electronic device of claim 19, wherein the TSV provides power from the power delivery network to the front side.

21. The electronic device of claim 17, wherein the metal wire M2 is discontinuous.

* * * * *